United States Patent
Frenkel et al.

(10) Patent No.: US 9,513,551 B2
(45) Date of Patent: Dec. 6, 2016

(54) PROCESS FOR PRODUCING A PHOTOMASK ON A PHOTOPOLYMERIC SURFACE

(75) Inventors: Moshe Frenkel, Jerusalem (IL); Yaacov Mazuz, Yavne (IL); Oleg Berezin, Maale Adumim (IL); Natalia Ivanova, Jerusalem (IL)

(73) Assignee: DIGIFLEX LTD., Kfar Saba (IL)

( * ) Notice: Subject to any disclaimer, the term of this patent is extended or adjusted under 35 U.S.C. 154(b) by 981 days.

(21) Appl. No.: 13/146,749

(22) PCT Filed: Jan. 27, 2010

(86) PCT No.: PCT/IL2010/000068
§ 371 (c)(1),
(2), (4) Date: Nov. 7, 2011

(87) PCT Pub. No.: WO2010/086850
PCT Pub. Date: Aug. 5, 2010

(65) Prior Publication Data
US 2012/0045583 A1    Feb. 23, 2012

Related U.S. Application Data

(60) Provisional application No. 61/202,109, filed on Jan. 29, 2009.

(51) Int. Cl.
| | | |
|---|---|---|
| *B05D 5/00* | (2006.01) |
| *B05D 5/04* | (2006.01) |
| *B05D 5/06* | (2006.01) |
| *B05D 1/36* | (2006.01) |
| *G03F 7/20* | (2006.01) |
| *G03F 1/00* | (2012.01) |

(52) U.S. Cl.
CPC .......... *G03F 7/2018* (2013.01); *G03F 1/0023* (2013.01)

(58) Field of Classification Search
None
See application file for complete search history.

(56) References Cited

U.S. PATENT DOCUMENTS

| | | | |
|---|---|---|---|
| 3,024,381 A * | 3/1962 | Dalton et al. | ............ 313/112 |
| 3,744,904 A | 7/1973 | Loprest et al. | |
| 3,877,810 A | 4/1975 | Feldstein | |
| 3,925,077 A | 12/1975 | Lewis et al. | |
| 4,002,478 A | 1/1977 | Kokawa et al. | |
| 4,107,351 A | 8/1978 | James et al. | |
| 4,139,443 A | 2/1979 | Sakurai | |
| 4,154,610 A * | 5/1979 | Katoh | ............ 430/236 |

(Continued)

FOREIGN PATENT DOCUMENTS

| | | |
|---|---|---|
| CN | 1175229 A | 3/1998 |
| EP | 0 087 582 A2 | 9/1983 |

(Continued)

OTHER PUBLICATIONS

Lin, et al., "Fast patterning microstructures using inkjet printing conformal masks", Microsyst Technol, vol. 14, pp. 1263-1267, (2008).

Chen, et al., "Gray-scale photolithography using microfluidic photomasks", PNAS, vol. 100, No. 4, pp. 1499-1504, (2003).

Glendinning, et al., "Microcircuit photomasks from automatic techniques", Electronic Devices, IEEE Transactions, vol. 12, Issue 12, pp. 638-642, (1965). Abstract.

(Continued)

*Primary Examiner* — Lisha Jiang
(74) *Attorney, Agent, or Firm* — Vorys, Sater, Seymour & Pease LLP

(57) ABSTRACT

A process is provided for printing a high resolution pattern on a photopolymeric surface.

16 Claims, 1 Drawing Sheet

(56) References Cited

U.S. PATENT DOCUMENTS

| | | | |
|---|---|---|---|
| 4,321,317 A | 3/1982 | MacIver | |
| 4,410,611 A | 10/1983 | MacIver | |
| 4,582,778 A | 4/1986 | Sullivan | |
| 4,610,941 A | 9/1986 | Sullivan | |
| 4,745,042 A | 5/1988 | Sasago et al. | |
| 4,822,718 A | 4/1989 | Latham et al. | |
| 4,906,552 A | 3/1990 | Ngo et al. | |
| 4,981,765 A | 1/1991 | Mizuguchi | |
| 5,123,998 A | 6/1992 | Kishimura | |
| 5,176,744 A * | 1/1993 | Muller | 106/1.26 |
| 5,272,026 A | 12/1993 | Roland et al. | |
| 5,290,647 A | 3/1994 | Miyazaki et al. | |
| 5,324,600 A | 6/1994 | Jinbo et al. | |
| 5,328,786 A | 7/1994 | Miyazaki et al. | |
| 5,334,359 A * | 8/1994 | Masutomi et al. | 422/225 |
| 5,387,497 A | 2/1995 | Douglas | |
| 5,486,449 A | 1/1996 | Hosono et al. | |
| 5,495,803 A | 3/1996 | Gerber et al. | |
| 5,523,184 A | 6/1996 | Hwang et al. | |
| 5,621,448 A | 4/1997 | Oelbrandt et al. | |
| 5,621,449 A | 4/1997 | Leenders et al. | |
| 5,739,898 A | 4/1998 | Ozawa et al. | |
| 5,851,702 A | 12/1998 | Watanabe et al. | |
| 5,922,508 A | 7/1999 | Zertani et al. | |
| 5,998,090 A | 12/1999 | Sabnis et al. | |
| 6,059,404 A | 5/2000 | Jaeger et al. | |
| 6,063,546 A | 5/2000 | Gelbart | |
| 6,117,621 A | 9/2000 | Hatakeyama et al. | |
| 6,165,685 A | 12/2000 | Maerz et al. | |
| 6,197,722 B1 | 3/2001 | Irving et al. | |
| 6,221,542 B1 | 4/2001 | Reinberg | |
| 6,235,435 B1 | 5/2001 | Peng | |
| 6,294,313 B1 | 9/2001 | Kobayashi et al. | |
| 6,296,975 B1 | 10/2001 | Moon et al. | |
| 6,312,857 B1 | 11/2001 | Nakagawa et al. | |
| 6,326,124 B1 | 12/2001 | Alince et al. | |
| 6,341,855 B1 | 1/2002 | Kurabayashi | |
| 6,342,096 B1 | 1/2002 | Kurabayashi | |
| 6,372,329 B1 | 4/2002 | Graczyk et al. | |
| 6,428,938 B1 | 8/2002 | Lin et al. | |
| 6,440,896 B1 | 8/2002 | Szajewski et al. | |
| 6,541,182 B1 | 4/2003 | Louis Joseph Dogue et al. | |
| 6,576,377 B2 | 6/2003 | Kikuchi | |
| 6,736,985 B1 | 5/2004 | Bao et al. | |
| 6,833,008 B2 | 12/2004 | Nitzan et al. | |
| 6,984,478 B2 | 1/2006 | Dreher et al. | |
| 7,008,733 B2 | 3/2006 | Lai | |
| 7,279,195 B2 | 10/2007 | Kano et al. | |
| 2002/0102501 A1 | 8/2002 | Ichikawa et al. | |
| 2003/0159607 A1 | 8/2003 | Nitzan et al. | |
| 2004/0027514 A1 | 2/2004 | Kobayashi et al. | |
| 2004/0244643 A1 | 12/2004 | Voeght et al. | |
| 2004/0266207 A1 | 12/2004 | Sirringhauss et al. | |
| 2005/0095529 A1* | 5/2005 | Sugasaki et al. | 430/270.1 |
| 2005/0142480 A1 | 6/2005 | Bode et al. | |
| 2005/0214484 A1* | 9/2005 | Kobayashi | 428/32.34 |
| 2005/0250052 A1 | 11/2005 | Nguyen | |
| 2006/0028521 A1* | 2/2006 | Frenkel | 347/100 |
| 2006/0073413 A1 | 4/2006 | Takemura et al. | |
| 2006/0073417 A1* | 4/2006 | Hermesdorf | B41M 5/52 430/302 |
| 2006/0078824 A1 | 4/2006 | Chiba et al. | |
| 2006/0083993 A1 | 4/2006 | Kirch et al. | |
| 2006/0083995 A1 | 4/2006 | Kanai | |
| 2006/0083996 A1 | 4/2006 | Kim | |
| 2006/0083997 A1 | 4/2006 | Lin et al. | |
| 2006/0083998 A1 | 4/2006 | Sivakumar et al. | |
| 2006/0088771 A1 | 4/2006 | Tan et al. | |
| 2006/0088774 A1 | 4/2006 | Yoshikawa et al. | |
| 2006/0100311 A1* | 5/2006 | Tokuda et al. | 523/160 |
| 2006/0160023 A1 | 7/2006 | Kobayashi et al. | |
| 2008/0028980 A1 | 2/2008 | Aoki et al. | |
| 2008/0092377 A1 | 4/2008 | Heitzinger et al. | |
| 2009/0297802 A1* | 12/2009 | Sastry et al. | 428/209 |

FOREIGN PATENT DOCUMENTS

| | | | |
|---|---|---|---|
| EP | 0 258 497 A1 | 3/1988 | |
| EP | 1 542 072 A2 | 6/2005 | |
| EP | 1 696 472 A1 | 8/2006 | |
| EP | 1 767 989 A1 | 3/2007 | |
| EP | 1 801 647 A1 | 6/2007 | |
| EP | 1 801 648 A1 | 6/2007 | |
| GB | 1 475 599 | 6/1977 | |
| GB | 2 009 442 A | 6/1979 | |
| GB | 2 164 654 A | 3/1986 | |
| JP | 54-31736 A | 3/1979 | |
| JP | 54-55378 A | 5/1979 | |
| JP | 56-43727 A | 4/1981 | |
| JP | 58-93236 A | 6/1983 | |
| JP | 58-96737 A | 6/1983 | |
| JP | 59-172727 A | 9/1984 | |
| JP | 60-263435 A | 12/1985 | |
| JP | 61-111528 A | 5/1986 | |
| JP | 62-196826 A | 8/1987 | |
| JP | 62-229834 A | 10/1987 | |
| JP | 63-29509 A | 2/1988 | |
| JP | 03029390 A * | 2/1991 | H05K 3/18 |
| JP | 3-147315 A | 6/1991 | |
| JP | 4-177758 A | 6/1992 | |
| JP | 5-53322 A | 3/1993 | |
| JP | 5-144693 A | 6/1993 | |
| JP | 5-197142 A | 8/1993 | |
| JP | 6-265708 A | 9/1994 | |
| JP | 10-158982 A | 6/1998 | |
| JP | 10-326743 A | 12/1998 | |
| JP | 11-143073 A | 5/1999 | |
| JP | 2003-261529 A | 9/2003 | |
| JP | 2006-501077 A | 1/2006 | |
| JP | 2006-310707 A | 11/2006 | |
| WO | 99/47981 A1 | 9/1999 | |
| WO | 99/48129 A1 | 9/1999 | |
| WO | 99/63406 A1 | 12/1999 | |
| WO | 00/46643 A1 | 8/2000 | |
| WO | 01/09679 A1 | 2/2001 | |
| WO | 02/41076 A2 | 5/2002 | |
| WO | 2005/029188 A1 | 3/2005 | |
| WO | 2005/093515 A1 | 10/2005 | |
| WO | 2005/116774 A1 | 12/2005 | |
| WO | 2005/116775 A1 | 12/2005 | |
| WO | 2006/004171 A1 | 1/2006 | |
| WO | 2006/025389 A1 | 3/2006 | |
| WO | 2006/046475 A1 | 5/2006 | |
| WO | 2007/000885 A1 | 1/2007 | |
| WO | 2007/010935 A1 | 1/2007 | |
| WO | 2008/010548 A1 | 1/2008 | |
| WO | 2008/022908 A1 | 2/2008 | |
| WO | 2008/049844 A1 | 5/2008 | |
| WO | 2008/055054 A2 | 5/2008 | |

OTHER PUBLICATIONS

Lee, et al., "Fabrication of large-area stamps, moulds, and conformable photomasks for soft lithography", Proc. IMechE, vol. 218, Part N: J. Nanoengineering and Nanosystems, pp. 1-5, (2005).

Day, et al., "Femtosecond fabricated photomasks for fabrication of microfluidic devices", Opt. Express, vol. 14, pp. 10753-10758, (2006). Abstract.

Wang, et al., "Bimetallic Thin Film Grayscale Photomasks for Complex 3D Microstructure Creation in SU-8", Electrical and Computer Engineering, CCECE 2007, pp. 959-962, (2007).

Colburn, et al., "Step and Flash Imprint Lithography: A New Approach to High-Resolution Patterning", Texas Materials Institute, The University of Texas at Austin, Austin, TX 78712, 11 pages; (1999).

The International Search Report for corresponding International Application No. PCT/IL2010/000068, mailed Jul. 23, 2010, 3 pages.

"High Resolution Photomask"; 1 page. Abstract.

* cited by examiner

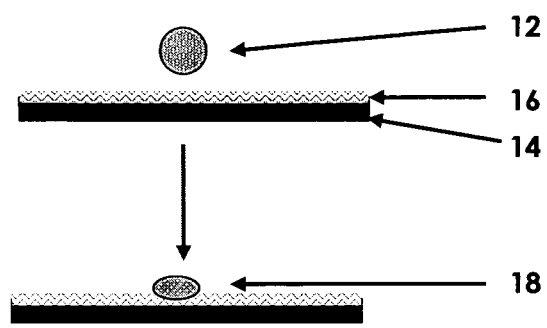

PROCESS FOR PRODUCING A PHOTOMASK ON A PHOTOPOLYMERIC SURFACE

This is a National Phase Application filed under 35 U.S.C. §371 as a national stage of PCT/IL2010/000068, filed on Jan. 27, 2010, an application claiming the benefit under 35 U.S.C. §119(e) of U.S. Provisional Application No. 61/202,109, filed on Jan. 29, 2009, the content of each of which is hereby incorporated by reference in its entirety.

FIELD OF THE INVENTION

The invention relates to processes for the production of photomasks on photopolymeric surfaces, e.g., photopolymeric plates.

BACKGROUND OF THE INVENTION

A typical procedure for the production of flexographic plates requires the preparing of a film which contains the image data required. The film is then attached on top of a photopolymer followed by exposure of the photopolymeric material to UV radiation through the film. One of the major drawbacks of this procedure is the deterioration of the quality of the image which is formed on top of the photopolymer due to UV light diffraction caused by the film base material.

Ink-jet technologies have been employed in the production of UV masks on top of photopolymeric materials, by direct printing of a desired image on top of the photopolymer, thereby eliminating the use of film. However, due to the limited viscosity of ink formulations applicable to ink-jet technologies, being typically 3-20 cPs, high print quality of the image cannot be achieved and problems such as bleeding, strike-through, clustering or feathering of the ink droplets have been observed.

Different strategies have been proposed as means to overcome problems associated with low printing quality, as for example is the case with ink-jet printing, among which is the use of an 'ink-jet substrate'. According to this proposed 'freezing by absorption' strategy, a substrate having a thin absorptive layer on its surface is used to absorb the ink droplet, and to thereby minimize alternations in drop size and maintain high image quality.

A different approach to achieving high printing quality is the 'freezing by chemical reaction' approach in which a substrate having a thin layer of a reactant on its surface is allowed to chemically undergo a reaction with a second reactant which is present in the ink. Once the ink droplet comes into contact with the thin layer on the surface of the substrate, an instantaneous chemical reaction occurs, which results in the immobilization of the ink droplet on the surface of the substrate.

The major difference between the two approaches ('freezing by absorption' and 'freezing by chemical reaction') is the nature of the substrate coating. While ink absorption requires a thick enough layer to absorb the whole ink droplet, the chemical approach requires a very thin layer of the reactant to be introduced on top of the substrate (typically <3 $\mu$ of a dry layer). This layer may be introduced onto any substrate, either before or as part of the printing process itself.

The technology utilizing the 'freezing' approach was mainly used for printing on paper, vinyl substrates as well as on offset plates. U.S. Pat. No. 6,833,008 to Nitzan et al. discloses a method for printing applications using water-based ink. Applying such a method in flexographic printing resulted in a very large ink-drop diameter of 200 microns, though having sharp edges, as compared to printing without applying the method.

Regular ink jet printing requires standard optical densities which are easily achievable by using dyes or pigment dispersions in the ink. However, several applications require exceptional high optical densities, for example, medical images, transparent boards and UV masks for photopolymeric imaging. Medical images, such as radiographic images, are typically viewed on a blue transparent support and require a high optical density, i.e., usually higher than 3.00 OD. Medical images of such high optical density are typically obtained by means of silver technology, in which an image is formed by exposing a light-sensitive silver salt to light and the subsequent development of the resulting black silver (by reduction).

The progress and development of the ink-jet technology and the higher costs associated with the silver technology have increased the desirability and the demand for obtaining medical images with ink jet technologies. However, the ink-jet technologies are associated with a problem unique only thereto; when high-density printing is conducted on a transparent recording medium, relatively high maximum optical densities in the image are harder to achieve as compared with the relatively high optical density of images obtained with the silver salt method.

U.S. Pat. No. 5,621,448 to Leo et al. and U.S. Pat. No. 5,621,449 to Leenders et al. disclose recording methods combining silver salts and ink-jet technology. U.S. Pat. No. 6,440,896 to Szajewski et al. and U.S. Pat. No. 6,197,722 to Irving et al. disclose the use of a dye coupler to intensify the color of the image post printing. WO1999063406 discloses a silver based method of manufacturing a photomask. WO2001009679 discloses a silver based method for producing photomask utilizing a laser plotter.

U.S. Pat. No. 6,342,096 to Kurabayashi et al. discloses an ink-jet recording method comprising applying a plurality of inks to a recording medium by an ink-jet system to form dual- or multi-toned image on the recording medium.

U.S. Pat. No. 6,341,855 to Kurabayashi et al. discloses an ink jet recording method capable of providing a record that has highly transmissible image density.

U.S. Pat. No. 6,059,404 to Jaeger et al. discloses an ink jet printing method and apparatus for the production of a high quality images having varying color intensities.

REFERENCES

[1] U.S. Pat. No. 6,833,008
[2] U.S. Pat. No. 5,621,448
[3] U.S. Pat. No. 5,621,449
[4] U.S. Pat. No. 6,440,896
[5] U.S. Pat. No. 6,197,722
[6] U.S. Pat. No. 6,342,096
[7] U.S. Pat. No. 6,341,855
[8] U.S. Pat. No. 6,059,404
[9] WO1999063406
[10] WO2001009679

SUMMARY OF THE INVENTION

The present invention generally relates to a process for producing a photomask on a photopolymeric surface such as a plate. The process comprises the formation of a UV absorbing pattern by direct printing on a surface of a photopolymeric material. Surprisingly, the process according to the invention provides a high quality UV absorbing image on a photopolymeric surface, with said image being of high quality, having high optical density, demonstrating no clustering effect or extensive dot gain post-printing and generally lacking all the disadvantages of ink-jet printing associated with bleeding, strike-through, clustering and feathering of the ink droplets.

Thus, the present invention generally provides a process for producing a photomask, a coating formulation suitable for coating a photopolymeric surface and printing formulations.

In one aspect, the present invention provides a process for producing a photo-mask on a photopolymeric surface, e.g., a photopolymeric plate, sheet, or any other such surface, said process comprising providing a photopolymeric surface, optionally having been coated with a film of at least one active component, direct printing on said surface (or film) at least one ink, to thereby affect immobilization of a plurality of ink droplets as ink dots to form a pattern on top of said surface (or film), said pattern being UV absorbing.

The photopolymeric surface is, in most general terms, composed of a photopolymeric material e.g., polymer, oligomer and monomer, which is photosensitive to actinic radiation, e.g., visible light, UV, IR, etc., and which upon exposure thereto polymerizes and/or cross-links to form a stable surface. Non-limiting examples of such photopolymeric materials are Nyloflex plates, manufactured by Flint; Cyrel plates, manufactured by DuPont; Sprint plates manufactured by Flint; Plates manufactured by Tokyo Ohra kogyo Co.; Novacryl; Elaslon; and MAX photopolymeric plates manufactured by MacDermid.

In some embodiments, the photopolymeric surface is at least one surface of a substrate, said substrate may or may not itself be composed of a photopolymeric material. The photopolymeric surface, as the substrate itself, may be of any size and shape. In some embodiments, the photopolymeric surface is in the form of a photopolymeric coating layer on top of at least one portion of a substrate. In further embodiments, the photopolymeric material is in the form of a sheet having a thickness of few microns, when used as a protective layer (e.g., in PCB, being an etch mask) or when used in offset plates and up to a few millimeters when used as a flexographic plate material.

In some embodiments, the photopolymeric surface is at least a surface portion of a plate, herein designated photopolymeric plate.

As known in the art, a photomask is an opaque pattern produced on the photopolymeric surface, following in shape and size the pattern having been directly printed thereon. The pattern produced by direct printing, as defined below, by employing e.g., one one or more ink jetting technique, may be of any shape, size, may be continous or discontinous. In some embodiemnts, the photomask is a UV-photomask.

The pattern of the photomask produced according to the process of the invention is "UV-absorbing" and may thus be referred to as a "UV-absorbing pattern". This pattern demonstrates light absorption in the UV spectral range of 250 to 600 nm thereby blocking UV light from penetrating through the printed pattern and reaching the underlying photopolymeric layer.

To permit UV blocking, independently of the immobilization described below, the ink employed is selected amongst the following ink formulations:
  a) an ink formulation comprising at least one UV absorbing material (the UV absorbing material being the ink material, molecules, or a UV absorbing material comprised in the ink formulation); or
  b) an ink formulation being UV transparent, i.e., allowing UV to penetrate therethrough, and comprising at least one first material which upon contact with at least one second material, not contained in said ink formulation, produces a UV absorbing material.

In some embodiments, the ink formulation comprises both a UV absorbing material and at least one first material as defined; the formulation being any combination of formulations (a) and (b) above.

In some embodiments, the ink formulation is an aqueous formulation. The at least one UV absorbing material is selected from:
  UV absorbing dyes; non limiting examples are Irgasperse Jet dyes (Ciba, Switzerland), Duasyn and Duasynjet grade dyes (Clariant, Germany), Basacid liquid dyes (BASF, Germany) and Bayscript dyes (Lanxess, Germany);
  UV absorbing pigments; non limiting examples are Ciba Cromophtal jet pigment (Ciba, Switzerland), Hostajet pigment preparations (Clariant, Germany), and Bayscript pigment dispersions (Lanxess, Germany);
  UV blocking materials; non limiting examples are Ciba Tinuvin products, UV Absorber HMBS (2-hydroxy-4-methoxy-benzophenon-5-sulfonic acid) (Riedel-de-Haen) and SPEEDBLOCK UV-3 (2-hydroxy-4-methoxy-benzophenon-5-sulfonic acid) (Lambson); and any mixture thereof.

In some embodiments, the ink formulation is comprised of a mixture of at least two ink formulations, one or more of said at lease two ink formulations being UV absorbing and the other comprising no UV absorbing materials (namely, comprising non-UV-absorbing materials).

In other embodiments, the pattern on the photopolymeric surface or on a film comprised of at least one active component, as disclosed below, may be formed by employing two different ink formulations, one or more of which being UV absorbing.

In some embodiments, the UV absorbing material is in the form of a salt being soluble in said aqueous formulation.

In some embodiments, the ink formulation comprises two or more different UV absorbing materials. In other embodiments, the ink formulation comprises at least one UV absorbing material and at least one first material which upon contact with at least one second material, not contained in said ink formulation, produces a UV absorbing material.

As stated hereinabove, the ink is printed onto the photopolymeric surface by "direct printing". As used herein, the term refers to a printing method by which the ink is transferred directly onto the photopolymeric surface, e.g., plate, sheet, etc. In some embodiments, the direct printing method employed is ink-jetting.

In order to produce a high print quality photomask on top of a photopolymeric surface, immobilization of each ink-droplet onto the surface is required. Thus, in some embodiments of the invention, the photopolymeric material, as defined, is precoated or coated in the process of the invention with an active film. The process, thus, further comprises the step of forming a film (layer or precoat) of at least one active component on at least a region of the photopolymeric surface. The at least one active component is selected to allow the printed ink undergo an interaction therewith and thus maximize immobilization (freezing) of said ink-droplet on the precoat film.

In some further embodiments, the process of the invention comprises providing a photopolymeric surface already precoated with a film of at least one active component, direct printing on the precoat film of at least one ink, to thereby form a pattern on the photopolymeric surface, the pattern being UV absorbing. The already precoated photopolymeric surface may be manufactured as such prior to employment of the process of the invention or manufactured in accordance with the invention.

The terms "immobilize" or any lingual variation thereof, as well as the interchangeably usable terms "freeze" and "jell" or any lingual variations thereof are used herein to denote instantaneous fixation of the ink-droplet on its landing site on the precoat film. The fixation of the droplet, which may result from a chemical or a physical interaction with the precoat, may be measured, as demonstrated hereinbelow, by measuring the expansion of the ink-droplet after it lands on the precoat over time or by the deviation from a uniform circular dot.

In some embodiments, the diameter of the ink dot obtained (being formed on the surface upon release of an ink-droplet) on top of the photopolymeric layer is identical to the diameter of a dot obtained, under the same printing conditions on top of a photo-paper or other ink-jet absorptive layer. In other embodiments, the diameter of the ink dot obtained on top of the photopolymeric layer is identical to the diameter of the original ink-droplet (e.g., as jetted). In some other embodiments, the diameter of the ink dot obtained on top of the photopolymeric layer is up to 200%, 195%, 190%, 185%, 180%, 175%, 170%, 165%, 160%, 155% or 150% of the diameter of the original ink-droplet. In some embodiments, the diameter of the ink dot obtained on top of the photopolymeric layer is up to between about 150%-200% of the diameter of the original ink-droplet. In still other embodiments, the diameter of the ink dot is up to 150% of the diameter of the original ink-droplet.

The immobilization of the ink-droplet on the surface of the precoat film results from an interaction between the ink-droplet and the material of the precoat film, said interaction being a chemical reaction or a physical interaction or a combination of the two. The interaction may be one or more of solvation, dissolution, gelation, coordination, complexation, electrostatic interaction, acid-base, ionic, covalent, surface interactions, etc. In some embodiments, the immobilization is due to increased viscosity of the ink-droplet upon landing on the precoat.

Various reactants may be introduced into the ink formulation to permit or increase reactivity of the ink with the precoat material and thus secure effective immobilization of the ink-droplet. In some embodiments, the at least one ink formulation comprises at least one anionic polymer (in a base form) at pH higher than 7.0. The at least one anionic polymer may be selected amongst acrylic resins and styrene-acrylic resins in their dissolved salt forms, such as sodium, ammonium or amine neutralized form. In such embodiments, and without wishing to be bound by a specific theoretical mechanism, the aforementioned resins undergo a reaction with the precoat materials, e.g., multi-valent cation, proton and/or polycationic polymer, to permit immobilization of the ink droplet.

All ink formulations disclosed herein are within the scope of the present invention.

Ink formulations based on polymer emulsions, e.g., acrylic polymer emulsions (an ink formulation in which the polymer is not dissolved but rather dispersed as an emulsion) may also be used. Such emulsions are typically stabilized by acrylic polymers which upon reaction with the precoat, break the emulsion and cause the immobilization of the ink-droplet.

In embodiments of the process of the invention, where the ink comprises at least one UV absorbing material, the immediate immobilization (freezing) of the ink-droplet permits fixation of the droplet in a desired pattern, to form a photomask having UV absorbing regions (the patterned regions covered with the at least one ink) and regions transparent to UV (photosensitive regions not covered by ink and forming the boundaries of the ink pattern). Upon exposure to actinic radiation, only the photosensitive regions undergo a chemical change while the photopolymer which underlies the UV absorbing regions remains unaffected.

In some embodiments, the ink formulation comprises at least one first material which upon contact with at least one second material, not contained in said ink formulation, produces a UV absorbing material. The at least one first and said at least one second materials are typically not UV absorbing.

The at least one second material is typically at least one material comprised in the precoat film. In some embodiments, the at least one second material is said at least one active component. In other embodiments, the at least one second material is a component comprised in a formulation comprising said at least one active component.

Upon application (printing) of the ink formulation comprising the at least one first material onto the precoat film, an interaction ensues between said at least one first material and said at least one second material, producing a product which is UV absorbing. In some embodiments, the interaction permits also instantaneous immobilization of the ink-droplet to the precoat film.

In some embodiments, said at least one first material is selected from a material capable of interacting with said at least one second material. Generally, the at least one first material is selected amongst a metal salt, Catechol and mixtures thereof. In some embodiments, the metal salt is selected from a cobalt salt, a plumbum salt, a potassium salt, a silver salt and mixtures thereof.

In some embodiments, the cobalt salt is cobalt acetate.

In some other embodiments, the plumbum salt is selected from lead acetate, lead nitrate, lead bromide and mixtures thereof Yet in further embodiments, the potassium salt is selected from potassium iodide, potassium thiocyanate, potassium hexacyanoferrate (II), potassium hexacyanoferrate III and mixtures thereof.

The silver salt is selected from silver nitrate or silver fluoride.

In some embodiments, said at least one second material is selected from ammonium thioglycolate, cysteine, sodium sulfide, a multi-valent metal ion salt and a mixture thereof.

In some embodiments, the multi-valent metal ion salt is a bi-valent metal ion salt, being selected, in a non-limiting fashion, from a ferrous ion (e.g., ferrous sulfate), a cupric ion (e.g., cupric sulfate), a zinc ion (e.g., zinc nitrate), a calcium ion (e.g., calcium acetate) and a magnesium ion (e.g., magnesium chloride).

In other embodiments, the multi-valent metal ion salt is a tri-valent metal ion salt, being selected from ferric ions (e.g., ferric sulfate).

In some embodiments, disclaimed is a combination of a second material selected from a silver salt and a first material selected from a reducing agent being capable of reducing the silver salt upon interaction therewith.

In some embodiments, the second material is soluble in an aqueous solution. In other embodiments, the second material is soluble in a non-aqueous solution. The non-aqueous solution may be selected from an alcohol of different chain length (e.g. methanol, ethanol, propanol, butanol, etc), a glycol (e.g., ethylene glycols, propylene glycols) and glycol ether (e.g., diethylene-glycol-mono-butyl-ether, diethylene-glycol-mono-ethyl-ether).

In a further aspect of the present invention there is provided a process comprising:
a) forming a film on a photopolymeric surface (e.g., to immobilize the at least one ink drop); and
b) printing on said film an ink formulation (one or more of the ink formulations disclosed herein);
to thereby form a pattern, e.g., UV-absorbing pattern, on the surface.

In some embodiments, the process comprising:
a) providing a photopolymeric surface, e.g., a plate, a sheet, etc;
b) coating the surface with a film of at least one active component (i.e., resulting in a precoat film of said at least one active component coating at least a region of said photopolymeric surface); and
c) direct printing on the precoat film at least one ink being UV-absorbing or comprising at least one UV absorbing material,
to thereby form a UV-absorbing pattern on the surface.

In some further embodiments, the photopolymeric surface is provided with a precoat of said at least one active component and the process of the invention comprises the steps:
a) providing a photopolymeric surface, e.g., a plate having a precoat film of at least one active component (coating at least a region of said photopolymeric surface); and
b) direct printing on the precoat film at least one ink being UV-absorbing or comprising at least one UV absorbing material,
to thereby form a UV-absorbing pattern on the surface.

In some embodiments, the precoat film of the at least one active component coats at least an area of the photopolymeric surface, e.g., plate. In some embodiments, said at least an area is continuous. In some other embodiments, said at least an area is two or more spaced-apart regions of the photopolymeric surface. In additional embodiments, said at least an area is the whole surface.

In some embodiments, the precoat film is a uniform, homogeneous, non-crystalline transparent film.

As disclosed herein, the photopolymeric surface may be provided for the purpose of the invention precoated. In some embodiments, coating of the photopolymeric surface is performed via any one specific printing method, or may be printed immediately prior to the printing of the photomask. In such embodiments, the printing may be performed via the same printing unit (separate print head) or via a further unit which is mounted on the same printer. In some embodiments, the printing of the coating is direct printing, e.g., ink jet printing.

Thus, in some embodiments, the at least one ink is directly printed on at least a region of the precoat film, regardless of the shape and size of the precoat film. In some embodiments, the precoat film may cover the whole surface of the photopolymeric plate, while the ink is printed onto a small area thereof. In other embodiments, the printing of said at least one ink fully covers the pattern of the precoat film. In some further embodiments, the printing of said at least one ink is performed over at least an area of the film pattern formed by at least one active component.

In another aspect of the present invention, there is provided a process for producing a photomask on a photopolymeric surface, e.g., plate, said process comprising providing a photopolymeric surface, e.g., a plate having a precoat film of at least one active component (coating at least a region of said photopolymeric surface) and direct printing on said precoat film a pattern of at least one ink, said ink comprising at least one first material which upon contact with at least one second material, comprised in said precoat film, produces a UV absorbing material, thereby forming a UV absorbing pattern on top of said photopolymeric surface.

In some embodiments, said direct printing is by ink-jet printing.

In some embodiments, the precoat film is a wet film. In further embodiments, the process of the invention comprises the step of drying said at least one precoat film. In additional embodiments, the precoat film is transparent to UV light and produces no scattering thereof.

In some embodiments, the process is optionally followed by exposure to actinic radiation, e.g., UV light or near UV light, typically to UV light (e.g., 365 nm or 254 nm), the photopolymer surface which was exposed to the radiation (the non-printed area) undergoes curing and becomes resistant to processing involving, e.g., chemical wash-out/developing procedures.

In a further aspect of the present invention, there is provided a photomask comprising at least one region of a UV absorbing material produced according to a process of the present invention.

In an additional aspect of the present invention, there is provided a photomask manufactured by a process comprising providing a photopolymeric surface, e.g., plate, direct printing on top of said surface at least one ink to thereby form a pattern on at least an area of the surface, the pattern being UV absorbing.

In a further aspect of the present invention, there is provided a photomask manufactured by a process comprising providing a photopolymeric surface, e.g., plate, coated with a film of at least one active component, direct printing on the coated surface at least one ink to thereby form a pattern on top of said surface, the pattern being UV absorbing.

In another aspect, the photomask manufactured according to the invention is for use in printing. Optionally, said photomask is for use in photolithography.

In some embodiments, the photomask produced according to the invention is in the form of a printing plate e.g., flexographic plate.

In some embodiments, the optical density of the UV absorbing material exceeds 2.5 at the UV spectral range of 250 to 600 nm. In some other embodiments, the optical density exceeds 3.0 at the range of 200 to 500 nm. In some other embodiments, the optical density at the UV spectral range of said UV-absorbing pattern is 3.0 and above.

In a further aspect of the present invention, there is provided a commercial package for use in the manufacture of a photomask on a photopolymeric surface, the package comprises a first container comprising at least one coating formulation for coating at least a region of a photopolymeric surface, a second container comprising at least one ink and instructions of use. The package may also comprise additional containers for holding one or more additional additives or formulations.

In a further aspect of the present invention, there is provided a formulation comprising:
a) at least one agent selected from a multi-valent salt, an acid, an acidic buffer solution and a poly-cationic polymer;
b) at least one wetting agent;
c) at least one anti-crystallization agent;
d) at least one plasticizer; and
e) optionally, at least one additive selected from a penetrating agent, a humectant and a bactericide.

In some embodiments, the formulation is for coating a photopolymeric surface. In some embodiments, coating is performed by means of spraying, brushing or dipping. In some other embodiments, the coating is by direct printing.

It is appreciated that certain features of the invention, which are, for clarity, described in the context of separate embodiments, may also be provided in combination in a single embodiment. Conversely, various features of the invention, which are, for brevity, described in the context of a single embodiment, may also be provided separately or in any suitable sub-combination or as suitable in any other described embodiment of the invention. Certain features described in the context of various embodiments are not to be considered essential features of those embodiments, unless the embodiment is inoperative without those elements.

BRIEF DESCRIPTION OF THE DRAWINGS

In order to understand the invention and to see how it may be carried out in practice, embodiments will now be described, by way of non-limiting examples only, with reference to the accompanying drawings, in which:

FIG. 1 is an illustration of a non-limiting embodiment of a process of the invention.

DETAILED DESCRIPTION OF EMBODIMENTS

FIG. 1 illustrates a non-limiting embodiment of the invention. In one embodiment, an ink droplet 12 comprising a UV absorbing material is brought into contact, e.g., by ink-jetting, with the surface of a photopolymeric plate 14 coated with a film 16 of at least one active component. Once the ink contacts the film 16 the viscosity of the ink droplet significantly increases and the drop 18 becomes practically immobilized on the film.

In another embodiment, an ink droplet 12 comprising a first material which is not UV absorbing, is brought into contact, as described above with the surface of a photopolymeric plate 14 coated with a film 16 of at least one active component. The at least one active component may by itself be the component which interacts with said first material or comprise a second material capable of undergoing such interaction. Once the ink drop contacts the film 16, the viscosity of the ink droplet significantly increases and the drop 18 becomes immobilized on the film. Simultaneously with the immobilization onto the surface, the first material contained in the ink drop and the second material contained in the film interact, resulting in the formation of a UV-absorbing material.

Reference is now made to the following examples, which together with the above illustrate the invention in a non-limiting fashion.

General preparation of coating formulations:

The following reactants are dissolved in an aqueous or an organic solvent medium:
  a) at least one agent selected from a multi-valent salt, an acid, an acidic buffer solution and a poly-cationic polymer such as poly di-allyl-di-methyl-ammonium-chloride (poly-DADMAC);
  b) at least one wetting agent such as Byk 348; BYK 345; Surfynol 485; and Tego-Wet 500;
  c) at least one anti-crystallization agent selected from a) a water soluble poly DADMAC; poly vinyl alcohol; poly vinyl pyrolidone; and b) a butanol soluble poly vinyl pyrolidone; and poly vinyl butyral-co-vinyl alcohol-co-vinyl acetate;
  d) at least one plasticizer;
  e) optionally, a penetrating agent;
  f) optionally, a humectant such as ethylene glycol and propylene glycol; and
  g) optionally a bactericide.

Without being bound by theory, the agent selected from a multi-valent salt, an acid, an acidic buffer solution and poly-cationic polymer, assists in the immobilization of the ink droplets, having the proper counter-reactant.

Non-limiting examples of said multi-valent salt are bi-valent cations such as calcium, magnesium, ferrous, cupric, cobalt, nickel and zinc with any anion which will provide sufficient solubility of the salt; tri-valent ions are, ferric, and cobalt ions.

Non-limiting examples of said acid are weak organic acids, e.g. citric acid or salts thereof which upon dissolution in an aqueous medium will demonstrate a pH lower than 4.0. Buffer solutions which demonstrate a pH value lower than 4.0 might be used as well.

Non-limiting example of said poly cationic polymer selected from polyethyleneimine and poly di-allyl-di-methyl-ammonium-chloride.

Without being bound by theory, the salt combination employed in the process of the invention is selected so as to avoid crystallization thereof on the surface of the photopolymeric plate and to consequently avoid scattering of the UV light which may bring about deterioration in the quality of the image formed on the photopolymeric layer. To eliminate light scattering it is essential also to employ salt mixtures which, upon drying, form a fully UV transparent salt layer. A combination of at least two salts having the same cation, two or more salts having a common anion or two or more different salts may be used to provide a dry layer exhibiting the required transparency to UV light.

Without being bound by theory, wetting agents are added to the precoat formulation to enable good wetting of the aqueous solution on top of the underlying photopolymeric layer. The wetting agents used may be commercially available and are typically selected to bring the surface tension of the precoat solution to 20-45 dyne/cm. Non-limiting examples of such wetting agents are those available, for example from BYK corporation, Tego, Air Products and others known to experts in the field.

Without being bound by theory, anti-crystallization agents eliminate salt crystallization on top of the photopolymeric layer, thus eliminating UV light scattering and providing the required transparency to UV light. Hence, the coating formulations both wet and upon drying, form a uniform non-crystalline transparent film on top of the photoplymeric surface which does not absorb or scatter any of the UV light.

Without being bound by theory, the at least one plasticizer are added to avoid cracking of the precoat film layer and enable high quality image on top of the photopolymeric surface. Non-limiting examples of such plasticizers are selected from poly-ethylene-glycol having a molecular weight of 400, poly-ethylene-glycol having a molecular weight of 600, poly-propylene-glycol having molecular weight of 725, poly-propylene-glycol having molecular weight 1000 and glycerol. In some embodiments, the at least one plasticizer is miscible with the precoat carrier (e.g., formulation).

In order to slow down the drying process of the precoat film and eliminating salt accumulation on the coating unit, in some embodiments, it is beneficial to incorporate one or more humectants in the formulation. Humectants are organic solvents which are completely miscible with the aqueous solution and demonstrate boiling points higher than water (>100° C.). Among the materials used are ethylene glycol, propylene glycol, di-ethylene glycol, di-propylene glycol as well as other glycols, and other water miscible compounds. In case where the coating layer is composed of an organic solvent the humectants, optionally used, will contain miscible organic solvents which may slow down the drying rate of the coat.

Without being bound by theory, the penetrating agents allow proper adhesion of the active component layer to the photopolymeric layer. Once a UV photomask is printed on the photopolymeric precoat film, it is essential to ensure a good adhesion of the mask to the photopolymeric layer. Various penetrating agents may, optionally, be used to achieve such results. Non-limiting examples are isopropyl alcohol, PMA (propylene glycol monoethyl ether acetate), iso-butanol, typically in an amount of 1-15% of the total weight of the formulation.

Addition of bactericides, e.g., in an amount of 0.1-1% is optional to prevent growth of bacteria in the aqueous solution during its shelf life.

Several reaction pairs of at least one first material of the ink formulation and at least one second material in the precoat film, producing a UV absorbing material, as disclosed and further detailed herein, are exemplified in Table 1 below:

TABLE 1

Reaction pairs of a first and a second material

| Reactant in ink (first material) | Reactant in precoat (second material) | Reaction product - the UV absorber |
|---|---|---|
| Silver salt | sodium sulfide | silver sulfide |
| Plumbum salt | sodium sulfide | plumbum sulfide |
| Cobalt salt | Cysteine | Cobalt cysteine salt |
| Cobalt (II) acetate tetra hydrate | sodium sulfide | cobalt sulfide |
| Cobalt (II) acetate tetra hydrate | ammonium thioglycolate | cobalt- thioglycolate |
| Potassium iodide | Cupric sulfate | cuprous iodide + iodine |
| Potassium iodide | Ferric sulfate | ferrous iodide + iodine |
| Potassium thiocyanate | Cupric salt | cupric thiocyanate |
| Potassium hexacyanoferrate (II) | Ferric sulfate | Prusian blue |
| Potassium hexacyanoferrate (III) | Ferrous sulfate | Blue precipitate |
| Catechol | Ferric nitrate | $[Fe(C_6H_4O_2)_3]^{3-}$ |

Materials and Methods

Epson Stylus C91 printer was used. The printer's three cartridges of Cyan, Magenta and Yellow have been replaced with the same ink formulation and printing was performed using 'photo-best' printing option (which consumes ink from all three cartridges simultaneously).

The following materials were used in exemplary formulations described in examples hereinbelow. Specified percentages (%) of ingredients are w/w (weight per weight) unless otherwise indicated. Molar concentrations as used herein are given in mole/liter i.e., M units.

Photopolymeric plate Now 1.14 available from DuPont.
Photopolymeric plate ACE 1.14 available from Flint.
Photopolymeric plate MAX 1.14 mm thick available from MacDermid.
Photopolymeric plate Cyrel 45 FD2 1.14 mm thick available from DuPont.
Bayscipt Black SP dye available from Lanxess.
NMP refers to n-methyl pyrrolidone available from Sigma-Aldrich.
BYK 348 and BYK 485 both available from BYK—Chemie.
Joncryl 8085 and Joncryl 8078 refer to styrene acrylic resin available from SC Johnson Polymers and from BASF.
Surfynol 485 available from Air Products.
PVA refers to poly vinyl alcohol of molecular weight of 13,000-23,000, available from Sigma-Aldrich.
PVP refers to polyvinyl pyrrolidone of molecular weight of 10,000 available from Sigma-Aldrich.
PSS refers to poly sodium 4-styrene sulfonate of molecular weight of 70,000, available from Sigma-Aldrich.
poly DADMAC refers to poly di-allyl di-methyl ammonium chloride of a molecular weight of 200,000-350,000, available as an 20% aqueous solution from Sigma Aldrich.
Poly-2-ethyl-2-oxazoline of a molecular weight of 500,000 available from Sigma-Aldrich.
Tego 500 available from Degussa.
Azo based black and yellow dye available from Lanxess.
Cupper phthalocyanine (direct blue 199) available from Lanxess.
EDTA refers to ethylene di-amine tetra acetic acid tetra-sodium salt tetra-hydrate available from Sigma Aldrich.

EXAMPLE 1

A Control Experiment: an Ink Formulation Free of a UV Absorber Printed on a Surface of a Non-coated Photopolymeric Plate An ink formulation was prepared as follows: 14% of Bayscript Black SP was dissolved in water containing 18% ethylene glycol, 2% of NMP and 0.01% of BYK 348. The ink was introduced into the Epson stylus C91 printer and printed on top of a photopolymeric plate Now 1.14.

The print pattern exhibited a very poor print quality with extremely poor edge definition, pinholes and severe clustering of droplets.

In view of the poor printing quality several coating formulations have been tested to provide uniform non-crystalline transparent coating films on the surfaces of photopolymeric plates.

EXAMPLE 2

An ink formulation was prepared as follows: 5% Joncryl 8085 styrene acrylic resin solution, supplied as a 42% polymer in aqueous solution, were added to the ink formulation of Example 1.

Photopolymeric plate Now 1.14 was coated with a 12 μ thick layer of a mixture of an aqueous solution of 10% zinc nitrate hexahydrate:calcium acetate mono-hydrate (6:4 w/w ratio) containing 1% of BYK 348. The coated plate was left to dry, resulting in a fully transparent coating over the whole plate surface with no crystal formation.

The ink formulation was printed on top of the coated photopolymeric plate. The resulting printing pattern demonstrated a superior print quality with very sharp edge definition and absent of clustering. Both positive and negative printed patterns were very well defined and thin lines at the range of 100-500 μ contained sharp edges and no line breaks. Solid areas demonstrated absolute lack of pinholes.

EXAMPLE 3

An ACE 1.14 photopolymeric plate was coated with a 12 μ layer of an aqueous solution of 0.5M copper nitrate hemi-hydrate [Cu(NO$_3$)$_2$·½H$_2$O] containing 1% of Surfynol 485. The coated plate was left to dry before the layer was closely examined. The dry layer demonstrated small crystals coating the whole plate surface in a non-homogenous form as well as light scattering from the plate surface.

EXAMPLE 4

An ACE 1.14 photopolymeric plate was coated with a 12 μ layer of an aqueous solution of 0.5M Cu(NO$_3$)$_2$·½H$_2$O containing 1% of Surfynol 485 and 1.25% of PVA (98% hydrolyzed). The coated plate was left to dry resulting in a non-uniform dry layer with small crystals coating the whole plate surface in a non-homogenous form as well as light scattering from the plate surface.

EXAMPLE 5

An ACE 1.14 photopolymeric plate was coated with a 12 μ layer of an aqueous solution of 0.5M copper sulfate penta-hydrate[CuSO$_4$·5H$_2$O] containing 1% of Surfynol 485. The coated plate was left to dry resulting in a non-uniform layer with small crystals coating the whole plate surface in a non-homogenous form as well as light scattering from the plate surface.

EXAMPLE 6

An ACE 1.14 photopolymeric plate was coated with a 12 μ layer of an aqueous solution of 10% calcium acetate mono-hydrate [Ca(OAc)$_2$·H$_2$O] containing 1% of BYK 348. The coated plate was left to dry resulting in a layer with small crystals coating the whole plate surface in a non-homogenous form as well as light scattering form the plate surface.

EXAMPLE 7

An ACE 1.14 photopolymeric plate was coated with a 12 μ layer of an aqueous solution of 10% calcium acetate mono-hydrate containing 2% of BYK 348 and 5% of PVP. The coated plate was left to dry resulting in a layer with small crystals coating the whole plate surface in a non-homogenous form as well as light scattering from the plate surface.

EXAMPLE 8

Photopolymeric plate Now 1.14 was coated with a 12 μ layer of an aqueous solution of 10% zinc nitrate hexa-hydrate [Zn(NO$_3$)$_2$·6H$_2$O] containing 1% of BYK 348. The coated plate was left to dry resulting in a layer with small crystals coating the whole plate surface in a non-homogenous form as well as light scattering from the plate surface.

EXAMPLE 9

Photopolymeric plate Now 1.14 was coated with a 12 μ layer of an aqueous solution of 0.375M copper nitrate hemi-hydrate and 0.125M of copper sulfate penta-hydrate (molar ratio of 3:1, respectively) containing 2% of BYK 348. The coated plate was left to dry resulting in a layer with small crystals coating the whole plate surface in a non-homogenous form as well as light scattering from the plate surface.

EXAMPLE 10

Photopolymeric plate Now 1.14 was coated with a 12 μ layer of an aqueous solution of 10% zinc nitrate hexahy-drate:calcium acetate mono-hydrate (6:4 w/w ratio) containing 1% of BYK 348. The coated plate was left to dry resulting in a fully transparent coating over the whole plate surface with no crystal formation.

EXAMPLE 11

An ACE 1.14 photopolymeric plate was coated with a 12 μ layer of an aqueous solution of 10% calcium acetate mono-hydrate containing 2% of BYK 348 and 5% PSS. The coated plate was left to dry resulting in a fully transparent coating over the whole plate surface with no crystal formation.

EXAMPLE 12

Photopolymeric plate Now 1.14 was coated with a 12 μ layer of an aqueous solution of 0.375M copper nitrate hemi-hydrate and 0.125M of copper sulfate penta-hydrate (molar ratio of 3:1, respectively) containing 1% Surfynol 485. The coated plate was left to dry resulting in a fully transparent coating over the whole plate surface with no crystal formation.

EXAMPLE 13

An ACE 1.14 photopolymeric plate was coated with coated with a 12 μ layer of an aqueous solution of 0.5M copper nitrate hemi-hydrate containing 2% of Surfynol 485 and 4% poly DADMAC polymer. The coated plate was left to dry resulting in a fully transparent coating over the whole plate surface with no crystal formation.

EXAMPLE 14

Photopolymeric plate Now 1.14 was coated with a 12 μ layer of an aqueous solution of 10% zinc nitrate hexahydrate containing 2% of BYK 348 and 4% poly DADMAC. The coated plate was left to dry resulting in a fully transparent coating over the whole plate surface with no crystal formation.

EXAMPLE 15

An ACE 1.14 photopolymeric plate was coated with a 12 μ layer of an aqueous solution of 0.5M copper sulfate penta-hydrate containing 2% of Surfynol 485 and 4% poly DADMAC. The coated plate was left to dry resulting in a fully transparent coating over the whole plate surface with no crystal formation.

In Examples 16 to 27 the use of plasticizers in the coating formulation is demonstrated.

EXAMPLE 16

A photopolymeric plate MAX 1.14 mm thick was coated with 24 μ layer of an aqueous solution of 6% Zinc Nitrate hexa-hydrate, 4% Calcium acetate hydrate, 2% poly-2-ethyl-2-oxazoline, 3% poly DADMAC, 2% poly-vinyl-pyrrolidone of a molecular weight of a molecular weight of 1,300,000 g/moles and 2% BYK.

The coated plate was dried at an elevated temperature of between 30° C. and 50° C. Thorough cracking of the coated layer was observed.

EXAMPLE 17

A photopolymeric plate MAX 1.14 mm thick was coated with 24 μ layer of an aqueous solution of 6% Zinc Nitrate hexa-hydrate, 4% Calcium acetate hydrate, 2% Poly-2-ethyl-2-oxazoline, 3% poly DADMAC, 2% poly-vinyl-pyrrolidone of a molecular weight of 1,300,000, 2% BYK 348 and 5% poly-ethylene-glycol of a molecular weight of 400.

In another example, the poly-ethylene-glycol was of a molecular weight of 600. The coated plates used in the two experiments were dried at an elevated temperature of between 30° C. and 50° C. No cracking of the coated layers was observed.

EXAMPLE 18

A photopolymeric plate MAX 1.14 mm thick was coated with 24 μ layer of an aqueous solution of 6% Zinc Nitrate hexa-hydrate, 4% Calcium acetate hydrate, 2% Poly-2-ethyl-2-oxazoline, 3% poly DADMAC, 2% poly-vinyl-pyrrolidone of a molecular weight of 1,300,000, 2% BYK 348 and 5% glycerol.

The coated plate was dried at elevated temperature of between 30° C. and 50° C. No cracking of the coated layer was observed.

EXAMPLE 19

A photopolymeric plate MAX 1.14 mm thick was coated with 24 μ layer of an aqueous solution of 6% Zinc Nitrate hexa-hydrate, 4% Calcium acetate hydrate, 2% Poly-2-ethyl-2-oxazoline, 3% poly DADMAC, 2% poly-vinyl-pyrrolidone of a molecular weight of 1,300,000, 2% BYK 348 and 5% poly-propylene-glycol of a molecular weight of 725.

In another example, the poly-propylene-glycol was of a molecular weight 1000.

The coated plate was dried at elevated temperature of between 30° C. and 50° C. Only slight cracking of the coated layer was observed.

EXAMPLE 20

A photopolymeric plate Cyrel 45 FD2, 1.14 mm thick was coated with 24 μ layer of an aqueous solution of 6% Zinc Nitrate hexa-hydrate, 4% Calcium acetate hydrate, 2% Poly-2-ethyl-2-oxazoline, 3% poly DADMAC, 2% poly-vinyl-pyrrolidone of a molecular weight of 1,300,000 and 2% BYK 348.

The coated plate was dried at elevated temperature of between 30° C. and 50° C. Thorough cracking of the coated layer was observed.

EXAMPLE 21

A photopolymeric plate Cyrel 45 FD2 was coated with 24 μ layer of an aqueous solution of 6% Zinc Nitrate hexa-hydrate, 4% Calcium acetate hydrate, 2% Poly-2-ethyl-2-oxazoline, 3% poly DADMAC, 2% poly-vinyl-pyrrolidone of a molecular weight of 1,300,000, 2% BYK 348 and 5% poly-ethylene-glycol of a molecular weight of 400.

In another example, the poly-ethylene-glycol was of a molecular weight of 600.

The coated plate was dried at elevated temperature of between 30° C. and 50° C. No cracking of the coated layer was observed.

EXAMPLE 22

A photopolymeric plate Cyrel 45 FD2 was coated with 24 μ layer of an aqueous solution of 6% Zinc Nitrate hexa-hydrate, 4% Calcium acetate hydrate, 2% Poly-2-ethyl-2-oxazoline, 3% poly DADMAC, 2% poly-vinyl-pyrrolidone of a molecular weight of 1,300,000, 2% BYK 348 and 5% glycerol.

The coated plate was dried at elevated temperature of between 30° C. and 50° C. No cracking of the coated layer was observed.

EXAMPLE 23

A photopolymeric plate Cyrel 45 FD2 was coated with 24 μ layer of an aqueous solution of 6% Zinc Nitrate hexa-hydrate, 4% Calcium acetate hydrate, 2% Poly-2-ethyl-2-oxazoline, 3% poly DADMAC, 2% poly-vinyl-pyrrolidone of a molecular weight of 1,300,000, 2% BYK 348 and 5% poly-propylene-glycol of a molecular weight of 725.

In another example, the poly-propylene-glycol was of a molecular weight 1000.

The coated plate was dried at elevated temperature of between 30° C. and 50° C. Only slight cracking of the coated layer was observed.

EXAMPLE 24

A photopolymeric plate MAX 1.14 mm thick was coated with 24 μ layer of an aqueous solution of 6% Zinc Nitrate hexa-hydrate, 4% Calcium acetate hydrate, 3% poly DADMAC, 3% poly-vinyl-pyrrolidone K90 of a molecular weight of 360,000 g/mole and 2% BYK 348.

The coated plate was dried at elevated temperature of between 30° C. and 50° C. Thorough cracking of the coated layer was observed.

EXAMPLE 25

A photopolymeric plate MAX 1.14 mm thick was coated with 24 μ layer of an aqueous solution of 6% Zinc Nitrate hexa-hydrate, 4% Calcium acetate hydrate, 3% poly DADMAC, 3% poly-vinyl-pyrrolidone K90 of a molecular weight of 360,000, 2% BYK 348 and 5% poly-ethylene-glycol, of a molecular weight of 400.

In another example, the poly-ethylene-glycol was of a molecular weight of 600.

The coated plate was dried at elevated temperature of between 30° C. and 50° C. No cracking of the coated layer was observed.

EXAMPLE 26

A photopolymeric plate Cyrel 45 FD2, 1.14 mm thick was coated with 24 μ layer of an aqueous solution of 6% Zinc Nitrate hexa-hydrate, 4% Calcium acetate hydrate, 3% poly DADMAC, 3% poly-vinyl-pyrrolidone K90 of a molecular weight of 360,000 and 2% BYK 348.

The coated plate was dried at elevated temperature of between 30° C. and 50° C. Thorough cracking of the coated layer was observed.

EXAMPLE 27

A photopolymeric plate Cyrel 45 FD2, 1.14 mm thick was coated with 24 μ layer of an aqueous solution of 6% Zinc Nitrate hexa-hydrate, 4% Calcium acetate hydrate, 3% poly DADMAC, 3% poly-vinyl-pyrrolidone K90 of a molecular weight of 360,000, 2% BYK 348 and 5% poly-ethylene-glycol of a molecular weight of 400.

In another example, the poly-ethylene-glycol was of a molecular weight of 600.

The coated plate was dried at elevated temperature of between 30° C. and 50° C. No cracking of the coated layer was observed.

In the formulations of Examples 28 to 32 the ink formulations used contained no UV absorbing materials. The UV masks were produced upon contact of the ink formulation with an active component on the covered photopolymeric plate.

EXAMPLE 28

An ink formulation was prepared as follows: 15% of Catechol (benzenediol) was added to a solution containing 15% propylene glycol, 5% glycerol, 1% of Tego-Wet 500 wetting agent, 10% Joncryl 8078 styrene acrylic polymer and 0.01% of EDTA. The pH of the solution was adjusted to 8.5 by further addition of ammonia.

An ACE 1.14 photopolymeric plate was coated with a 80-micron layer of an aqueous solution containing 10% Ferric nitrate hexa-hydrate, 2% of BYK 348, 7.5% of PVP and 10% of a mixture of zinc nitrate hexahydrate:calcium acetate mono-hydrate (6:4 w/w ratio).

The ink formulation was printed on top of the coated photopolymeric plate. The printing pattern demonstrated a high quality image with optical density of the resulting image exceeding 2.5 at the range of 250-500 nm.

Without being bound by theory, the basic solution of catechol had reacted with iron(III) to give the red product $[Fe(C_6H_4O_2)_3]^{3-}$ which had rapidly changed to a green and finally to a black color on exposure to the air.

EXAMPLE 29

An ink formulation was prepared as follows: An aqueous solution of 30% silver nitrate, 1% of Tego 500 and 15% ethylene glycol was prepared. Ammonia solution was added to the solution until it became clear.

An ACE 1.14 photopolymeric plate was coated with a 40-micron layer of an aqueous solution containing 12% sodium sulfide and 2% of BYK 348.

The ink formulation was printed on top of the coated photopolymeric plate. The printing pattern demonstrated a high quality image with optical density of the image exceeding 2.5 at the range of 250-500 nm.

EXAMPLE 30

An ink formulation was prepared as follows: An aqueous solution of 10% propylene glycol, 0.8M Cobalt (II) acetate tetra-hydrate and 1% of BYK 348 was prepared.

Photopolymeric plate Now 1.14 was coated with a 40-micron layer of an aqueous solution containing 12% sodium sulfide nona-hydrate and 2% of BYK 348.

The ink formulation was printed on top of the coated photopolymeric plate. The pattern demonstrated a high quality image with optical density exceeding 2.5 at the range of 250-500 nm.

EXAMPLE 31

An ink formulation was prepared as follows: An aqueous solution containing 13% propylene glycol, 0.8M Cobalt (II) acetate tetra hydrate, 1% of BYK 348 was prepared.

Photopolymeric plate Now 1.14 was coated with a 24-micron layer of an aqueous solution containing 25% Cysteine, 1% of BYK 348 and 0.4M sodium hydroxide.

The ink formulation was printed on top of the coated photopolymeric plate. The pattern demonstrated a high quality image with optical density of the image exceeding 2.5 at the range of 250-500 nm.

EXAMPLE 32

An ink formulation was prepared as follows: An aqueous solution containing 20% propylene glycol, 0.8M Cobalt (II) acetate tetra hydrate and 1% of BYK 348 was prepared.

An ACE 1.14 photopolymeric was coated with a 40-micron layer of an aqueous solution containing 60% ammonium thioglycolate and 2% of BYK 348.

The ink formulation was printed on top of the coated photopolymeric plate. The pattern demonstrated a high quality image with the optical density of the image exceeding 2.5 at the range of 250-500 nm.

EXAMPLE 33

An ink formulation containing a UV absorbing material was prepared as follows: An aqueous solution containing 17% propylene glycol, 4% of Joncryl 8085, 0.6% of Tego 500, 9% (solid base) of azo based black dye, 3% (solid base) of azo based yellow dye and 3% (solid base) of cupper phthalocyanine (direct blue 199) was prepared. The pH of the solution was adjusted to 8.5 by addition of few drops of ammonia and 0.01% of EDTA.

Photopolymeric plate Now 1.14 was coated with a 12-micron layer of an aqueous solution containing 10% of a mixture of zinc nitrate hexahydrate:calcium acetate mono-hydrate (6:4 w/w ratio), 2% of BYK 348 and 4% poly DADMAC solution.

The ink formulation was printed on top of the coated photopolymeric plate. The pattern demonstrated a high quality image with the optical density of the image exceeding 3 at the range of 250-600 nm.

The invention claimed is:
1. A process for producing a photo-mask on a photopolymeric surface, comprising:
providing a photopolymeric surface having been coated with a film, wherein said film is comprised of
at least one active component,
at least one agent selected from the group consisting of a multi-valent salt, an acid, an acidic buffer solution, and a poly-cationic polymer,
at least one wetting agent,
at least one polymeric anti-crystallization agent,
at least one plasticizer,
optionally at least one additive selected from the group consisting of a penetrating agent, a humectant, and a polymer,
and at least one second material which is the same or different from the at least one active component; and
directly printing on said film at least one ink, wherein
said at least one ink is comprised of at least one anionic polymer, the at least one anionic polymer undergoing a first interaction with at least one of the at least one active component, the at least one agent, or the at least one second material, and wherein
the first interaction is a chemical reaction, a physical reaction, or a combination thereof that affects immobilization of a plurality of ink droplets as a corresponding plurality of immobilized ink dots on the film, said immobilization forming a UV-absorbing pattern on top of said film.

2. The process according to claim 1, wherein the at least one ink is UV-absorbing or comprises at least one UV-absorbing material.

3. The process according to claim 1, wherein the size and shape of at least one of the immobilized ink dots is identical to the size and shape of the corresponding ink droplet of said plurality of ink droplets.

4. The process according to claim 1, wherein the diameter of at least one of the immobilized ink dots is up to 200% of the diameter of the corresponding ink droplet of said plurality of ink droplets.

5. The process according to claim 1, wherein the at least one ink is comprised of at least one first material that undergoes a second interaction, which occurs upon contact of the at least one first material with the at least one second material and produces a UV-absorbing material.

6. The process according to claim 5, wherein the second interaction is an ionic interaction, a covalent interaction, a complexation, or any combination thereof.

7. The process according to claim 5, wherein the at least one first material is a material selected from the group consisting of a metal salt, Catechol, and mixtures thereof.

8. The process according to claim 7, wherein the metal salt is selected from the group consisting of a cobalt salt, a plumbum salt, a potassium salt, a silver salt, and mixtures thereof.

9. The process according to claim 5, wherein the at least one second material is selected from the group consisting of ammonium thioglycolate, cysteine, sodium sulfide, a multivalent metal ion salt, and mixtures thereof.

10. The process according to claim 5, wherein the size and shape of at least one of the immobilized ink dots is identical to the size and shape of the corresponding ink droplet of said plurality of ink droplets.

11. The process according to claim 5, wherein the diameter of at least one of the immobilized ink dots is up to 200% of the diameter of the corresponding ink droplet of said plurality of ink droplets.

12. The process according to claim 1, wherein the film is transparent, homogeneous, uniform, and non-crystalline.

13. The process according to claim 1, wherein the first interaction is selected from the group consisting of solvation, dissolution, gelation, coordination, complexation, electrostatic interaction, acid-base interaction, ionic interaction, covalent interaction, surface interaction, and combinations thereof.

14. The process according to claim 13, wherein the first interaction is a gelation interaction and wherein said immobilization is due to an increase in the viscosity of at least one of the plurality of ink droplets upon landing on said film.

15. The process according to claim 1, wherein the diameter of at least one of the immobilized ink dots is from 150% to 200% of the diameter of the corresponding ink droplet of said plurality of ink droplets.

16. The process according to claim 1, wherein said anionic polymer is selected from the group consisting of acrylic resin and styrene-acrylic resin.

* * * * *